(12) United States Patent
Murai et al.

(10) Patent No.: US 11,745,482 B2
(45) Date of Patent: Sep. 5, 2023

(54) FLUORORESIN SUBSTRATE LAMINATE

(71) Applicant: Showa Denko Materials Co., Ltd., Tokyo (JP)

(72) Inventors: Kosuke Murai, Tokyo (JP); Takao Tanigawa, Tokyo (JP); Minoru Kakitani, Tokyo (JP); Makoto Yanagida, Tokyo (JP); Mami Shimada, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 0 days.

(21) Appl. No.: 17/081,090

(22) Filed: Oct. 27, 2020

(65) Prior Publication Data

US 2021/0187923 A1 Jun. 24, 2021

(30) Foreign Application Priority Data

Oct. 29, 2019 (JP) ................................ 2019-195963

(51) Int. Cl.

| | |
|---|---|
| *B32B 27/32* | (2006.01) |
| *B32B 7/12* | (2006.01) |
| *B32B 15/085* | (2006.01) |
| *C09J 7/24* | (2018.01) |
| *C09J 7/30* | (2018.01) |
| *C09J 139/04* | (2006.01) |

(52) U.S. Cl.
CPC ............ *B32B 27/322* (2013.01); *B32B 7/12* (2013.01); *B32B 15/085* (2013.01); *C09J 7/241* (2018.01); *C09J 7/30* (2018.01); *C09J 139/04* (2013.01); *B32B 2250/02* (2013.01); *B32B 2250/03* (2013.01); *B32B 2307/538* (2013.01); *B32B 2457/08* (2013.01); *C09J 2301/30* (2020.08); *C09J 2427/006* (2013.01)

(58) Field of Classification Search
None
See application file for complete search history.

(56) References Cited

U.S. PATENT DOCUMENTS

| | | | |
|---|---|---|---|
| 2005/0121226 A1* | 6/2005 | McKee | H05K 1/036 174/259 |
| 2011/0005812 A1* | 1/2011 | Shimokawa | B32B 15/08 174/255 |
| 2017/0051109 A1* | 2/2017 | Mizuno | C08K 3/00 |
| 2019/0241717 A1* | 8/2019 | Tanigawa | H05K 1/03 |
| 2019/0241729 A1* | 8/2019 | Tanigawa | H05K 1/03 |

(Continued)

FOREIGN PATENT DOCUMENTS

| | | |
|---|---|---|
| JP | S56-114576 | 9/1981 |
| JP | S58-069046 A | 4/1983 |
| JP | 2003-171480 A | 6/2003 |

(Continued)

*Primary Examiner* — Ramsey Zacharia
(74) *Attorney, Agent, or Firm* — FITCH, EVEN, TABIN & FLANNERY, LLP

(57) ABSTRACT

The present disclosure relates to a fluororesin substrate laminate for a high-frequency circuit, the fluororesin substrate laminate including a fluororesin substrate and an adhesive layer provided on the fluororesin substrate, wherein the adhesive layer includes a resin composition containing: (A) a maleimide compound having a saturated or unsaturated divalent hydrocarbon group; and (B) an aromatic maleimide compound.

14 Claims, 2 Drawing Sheets

(56) References Cited

U.S. PATENT DOCUMENTS

2020/0165501 A1\* 5/2020 Liao ................ C09J 127/18

FOREIGN PATENT DOCUMENTS

| JP | 2012-255059 A | 12/2012 | | |
|---|---|---|---|---|
| JP | 2014-060449 A | 4/2014 | | |
| JP | 2016-204639 | 12/2016 | | |
| WO | WO-2018016489 A1 \* | 1/2018 | ........... | C08K 5/3415 |
| WO | WO-2018016530 A1 \* | 1/2018 | ............... | B32B 5/28 |

\* cited by examiner

FLUORORESIN SUBSTRATE LAMINATE

TECHNICAL FIELD

The present invention relates to a fluororesin substrate laminate for a high-frequency circuit.

The present application claims priority from Japanese Patent Application No. 2019-195963, filed Oct. 29, 2019, the entire disclosure of which is incorporated herein by reference.

BACKGROUND

With regard to mobile communication devices represented by mobile telephones, base station apparatuses thereof, network infrastructure devices such as servers and routers, and electronic devices such as large-sized computers, speeding up and capacity increase of signals used for the devices are in progress every year. Along with this, printed wiring boards on which these electronic devices are mounted require countermeasures for increasing frequency, and there is a demand for a substrate material having a low dielectric constant and a low dielectric loss tangent, which makes it possible to reduce the transmission loss. In recent years, regarding applications for handling such high frequency signals, in addition to the fields of the above-mentioned electronic devices, practicalization and schemes for practical use of novel systems that handle high frequency radio signals are in progress even in the fields of information technology systems (related to automobile and transportation systems) and indoor short-range communication. It is anticipated that in the near future, there will be a demand for a low-transmission loss substrate material even for printed wiring boards that are mounted on those devices.

Furthermore, in view of the environmental problems emerging in recent years, there is a demand for packaging of electronic component parts using lead-free solder and for halogen-free flame retardation, and accordingly, materials for printed wiring boards are required to have higher heat resistance and flame retardancy than ever.

In printed wiring boards where low transmission loss is required, resins such as polyphenylene ether (PPE), polyimide (PI), liquid crystalline polymers (LCP), and fluororesins have been hitherto used (see, for example, JP S58-69046 A, JP 2012-255059 A, JP 2014-60449 A, and JP 2003-171480 A).

SUMMARY

Fluororesins are known to be materials having low hygroscopic properties and having excellent low-dielectric constant and low-dielectric loss tangent characteristics. However, since fluororesins such as polytetrafluoroethylene (PTFE) have low adhesiveness to metal foils, it is difficult to laminate a fluororesin with a metal foil having low surface roughness (for example, low-roughened copper foil). Therefore, when a fluororesin substrate is used in a high frequency range, the transmission loss tends to increase as compared to substrates formed of PPE, PI, LCP, and the like.

It is an object of the present invention to provide a fluororesin substrate laminate that has low hygroscopic properties, has excellent low-dielectric constant and low-dielectric loss tangent characteristics, and can also reduce transmission loss in a high frequency range.

An aspect of the present disclosure relates to a fluororesin substrate laminate for a high-frequency circuit, the fluororesin substrate laminate comprising a fluororesin substrate and an adhesive layer provided on the fluororesin substrate, wherein the adhesive layer includes a resin composition containing: (A) a maleimide compound having a saturated or unsaturated divalent hydrocarbon group; and (B) an aromatic maleimide compound.

According to the present invention, a fluororesin substrate laminate that has low hygroscopic properties, has excellent low-dielectric constant and low-dielectric loss tangent characteristics, and can reduce transmission loss in a high frequency range, can be provided.

DETAILED DESCRIPTION

Hereinafter, suitable embodiments of the present invention will be described in detail. However, the present invention is not intended to be limited to the following embodiments. Incidentally, in the present specification, a high frequency range refers to a range of 0.3 GHz to 300 GHz, and particularly, a high frequency range is intended to refer to a range of 3 GHz to 300 GHz.

<Fluororesin Substrate Laminate>

Figure 1:
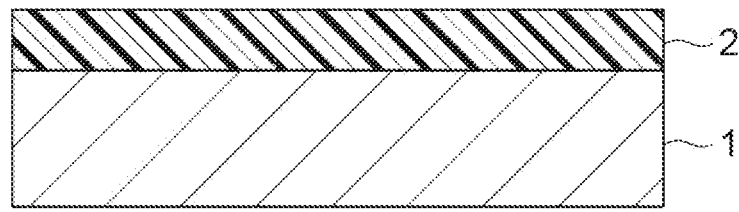
FIG. 1 is a schematic cross-sectional view illustrating an embodiment of a fluororesin substrate laminate.

FIG. 1 is a schematic cross-sectional view illustrating an embodiment of a fluororesin substrate laminate. The fluororesin substrate laminate for a high-frequency circuit according to the present embodiment comprises a fluororesin substrate 1 and an adhesive layer 2 provided on the fluororesin substrate 1.

[Adhesive Layer]

The adhesive layer 2 according to the present embodiment includes a resin composition containing: (A) a maleimide compound having a saturated or unsaturated divalent hydrocarbon group; and (B) an aromatic maleimide compound. The adhesive layer 2 has excellent adhesiveness to the fluororesin substrate 1 and also has superior adhesiveness to metal foils as will be described below. Thereby, the transmission loss in a high frequency range of the fluororesin substrate laminate can be reduced.

The thickness of the adhesive layer 2 is not particularly limited; however, for example, the thickness may be 1 to 200 µm, 3 to 180 µm, 5 to 150 µm to 100 or 15 to 80 µm. By adjusting the thickness of the adhesive layer 2 to the above-described range, the high frequency characteristics of the laminate according to the present embodiment are more easily enhanced.

The adhesive layer 2 may be formed by applying the above-described resin composition on the fluororesin substrate 1 or may be formed by producing a resin film of the above-described resin composition and laminating the resin film on the fluororesin substrate 1. A resin film refers to an uncured or semi-cured film-like resin composition. In the following description, the various components included in the resin composition will be described in detail.

((A) Maleimide Compound Having Saturated or Unsaturated Divalent Hydrocarbon Group)

The maleimide compound having a saturated or unsaturated divalent hydrocarbon group according to the present embodiment may be referred to as component (A). Component (A) is a compound having: (a) a maleimide group and (c) a saturated or unsaturated divalent hydrocarbon group. The (a) maleimide group may be referred to as structure (a), and the (c) saturated or unsaturated divalent hydrocarbon group may be referred to as structure (c). By using the component (A), a resin composition having excellent high frequency characteristics and adhesiveness can be obtained.

The component (A) may further have (b) a divalent group having at least two imide bonds, in addition to the structure (a) and the structure (c). The (b) divalent group having at least two imide bonds may be referred to as structure (b).

The (a) maleimide group is not particularly limited and is a general maleimide group. The (a) maleimide group may be bonded to an aromatic ring or may be bonded to an aliphatic chain; however, from the viewpoint of dielectric characteristics, it is preferable that the (a) maleimide group is bonded to a long-chain aliphatic chain (for example, a saturated hydrocarbon group having 8 to 100 carbon atoms). When the component (A) has a structure in which the (a) maleimide group is bonded to a long-chain aliphatic chain, the high frequency characteristics of the resin composition can be further enhanced.

The structure (b) is not particularly limited; however, for example, a group represented by the following For nula (I) may be mentioned. The structure (b) is a group that does not have a maleimide group.

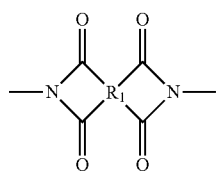
(I)

In Formula (I), $R_1$ represents a tetravalent organic group. $R_1$ is not particularly limited so long as it is a tetravalent organic group; however, for example, from the viewpoint of handleability, $R_1$ may be a hydrocarbon group having 1 to 100 carbon atoms, may be a hydrocarbon group having 2 to 50 carbon atoms, or may be a hydrocarbon group having 4 to 30 carbon atoms.

$R_1$ may include a substituted or unsubstituted siloxane site. Examples of the siloxane site include structures derived from dimethylsiloxane, methylphenylsiloxane, diphenylsiloxane, and the like.

In a case in which $R_1$ is substituted, examples of the substituent include an alkyl group, an alkenyl group, an alkynyl group, a hydroxyl group, an alkoxy group, a mercapto group, a cycloalkyl group, a substituted cycloalkyl group, a heterocyclic group, a substituted heterocyclic group, an aryl group, a substituted aryl group, a heteroaryl group, a substituted heteroaryl group, an aryloxy group, a substituted aryloxy group, a halogen atom, a haloalkyl group, a cyano group, a nitro group, a nitroso group, an amino group, an amide group, —CHO, —$NR_xC(O)$—$N(R_x)_2$, —OC(O)—$N(R_x)_2$, an acyl group, an oxyacyl group, a carboxyl group, a carbamate group, and a sulfonamide group. Here, $R_x$ represents a hydrogen atom or an alkyl group. Regarding these substituents, one kind or two or more kinds can be selected according to the purpose, use application, and the like.

As $R_1$, for example, a tetravalent residue of an acid anhydride having two or more anhydride rings in one molecule, that is, a tetravalent group obtained by removing two acid anhydride groups (—C(=O)OC(=O)—) from an acid anhydride, is preferable. Examples of the acid anhydride include the compounds that will be described below.

From the viewpoint of mechanical strength, $R_1$ is preferably an aromatic group, and more preferably a group obtained by removing two acid anhydride groups from pyromellitic dianhydride. That is, the structure (b) is more preferably a group represented by the following Formula (III).

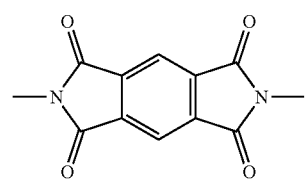
(III)

From the viewpoints of fluidity and circuit embedding property, it is preferable that a plurality of the structures (b) exist in the component (A). In that case, the structures (b) may be identical to or different from one another. The number of the structures (b) in the component (A) is preferably 2 to 40, more preferably 2 to 20, and even more preferably 2 to 10.

From the viewpoint of dielectric characteristics, the structure (b) may also be a group represented by the following Formula (IV) or the following Formula (V).

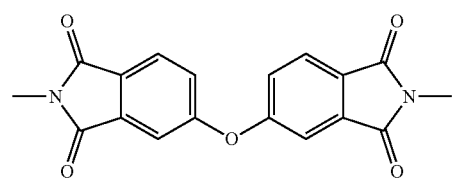
(IV)

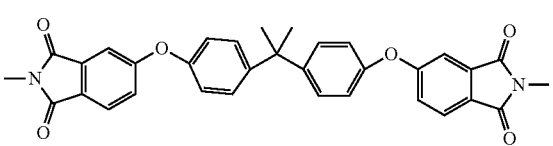
(V)

The structure (c) is not particularly limited and may be any of a linear, branched, or cyclic structure. From the viewpoint of high frequency characteristics, the structure (c) is preferably an aliphatic hydrocarbon group. Furthermore, the saturated or unsaturated divalent hydrocarbon group may have 8 to 100 carbon atoms. The structure (c) is preferably an alkylene group which may have a branch having 8 to 100 carbon atoms, more preferably an alkylene group which may have a branch having 10 to 70 carbon atoms, and even more preferably an alkylene group which may have a branch having 15 to 50 carbon atoms. When the structure (c) is an alkylene group which may have a branch having 8 or more carbon atoms, it is easy to three-dimensionalize the molecular structure, and it is easy to lower the density by increasing the free volume of the polymer. That is, since the dielectric constant of the resin composition can be lowered, the high frequency characteristics of the resin composition are easily enhanced. Furthermore, as the component (A) has the structure (c), flexibility of the resin composition is enhanced, and it is possible to increase the handleability (tackiness, cracking, dust generation, and the like) and strength of the adhesive layer (resin film) produced from the resin composition.

Examples of the structure (c) include alkylene groups such as a nonylene group, a decylene group, an undecylene group, a dodecylene group, a tetradecylene group, a hexadecylene group, an octadecylene group, and a nonadecylene group; arylene groups such as a benzylene group, a phenylene group, and a naphthylene group; arylene-alkylene groups such as a phenylene-methylene group, a phenylene-ethylene group, a benzyl-propylene group, a naphthylene-methylene group, and a naphthylene-ethylene group; and arylene-dialkylene groups such as a phenylene-dimethylene group and a phenylene-diethylene group.

From the viewpoints of high frequency characteristics, low thermal expansion characteristics, adhesiveness to conductors, heat resistance, and low hygroscopic properties, a group represented by the following Formula (II) is particularly preferable as the structure (c).

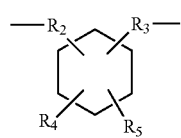
(II)

In Formula (II), $R_2$ and $R_3$ each independently represent an alkylene group having 4 to 50 carbon atoms. From the viewpoint of further enhancement of pliability and ease of synthesis, it is preferable that $R_2$ and $R_3$ each independently represent an alkylene group having 5 to 25 carbon atoms, more preferably an alkylene group having 6 to 10 carbon atoms, and even more preferably an alkylene group having 7 to 10 carbon atoms.

In Formula (II), $R_4$ represents an alkyl group having 4 to 50 carbon atoms. From the viewpoint of further enhancement of pliability and ease of synthesis, $R_4$ is preferably an alkyl group having 5 to 25 carbon atoms, more preferably an alkyl group having 6 to 10 carbon atoms, and even more preferably an alkyl group having 7 to 10 carbon atoms.

In Formula (II), $R_5$ represents an alkyl group having 2 to 50 carbon atoms. From the viewpoints of further enhancement of pliability and ease of synthesis, $R_5$ is preferably an alkyl group having 3 to 25 carbon atoms, more preferably an alkyl group having 4 to 10 carbon atoms, and even more preferably an alkyl group having 5 to 8 carbon atoms.

From the viewpoint of fluidity and circuit embedding property, it is preferable that a plurality of the structures (c) exist in the component (A). In that case, the structures (c) may be identical to or different from one another. For example, it is preferable that 2 to 40 units of the structure (c) exist in the component (A), it is more preferable that 2 to 20 units of the structure (c) exist, and it is even more preferable that 2 to 10 units of the structure (c) exist.

The content of the component (A) in the resin composition is not particularly limited. From the viewpoint of heat resistance, the content of the component (A) is preferably 2% to 98% by mass, more preferably 10% to 50% by mass, and even more preferably 10% to 30% by mass, with respect to the total mass of the resin composition.

The molecular weight of the component (A) is not particularly limited. From the viewpoint of handleability, fluidity, and circuit embedding property, the weight average molecular weight (Mw) of the component (A) is preferably 500 to 10000, more preferably 1000 to 9000, even more preferably 1500 to 9000, still more preferably 1500 to 7000, and particularly preferably 1700 to 5000.

The Mw of the component (A) can be measured by a gel permeation chromatography (GPC) method.

The measurement conditions for GPC are as follows.
Pump: Model L-6200 [manufactured by Hitachi High-Technologies Corp.]
Detector: Model L-3300 RI [manufactured by Hitachi High-Technologies Corp.]
Column oven: L-655A-52 [manufactured by Hitachi High-Technologies Corp.]
Guard column and column: TSK Guardcolumn HHR-L+ TSKgel G4000HHR+TSKgel G2000HHR [all manufactured by Tosoh Corp., trade names]
Column size: 6.0 x 40 mm (guard column), 7.8 x 300 mm (column)
Eluent: Tetrahydrofuran
Sample concentration: 30 mg/5 mL
Injection amount: 20 μL
Flow rate: 1.00 mL/min
Measurement temperature: 40° C.

The method for producing the component (A) is not limited. The component (A) may be produced by, for example, reacting an acid anhydride with a diamine to synthesize an amine-terminated compound, and then reacting the amine-terminated compound with an excess amount of maleic anhydride.

Examples of the acid anhydride include pyromellitic anhydride, maleic anhydride, succinic anhydride, 3,3',4,4'-benzophenonetetracarboxylic acid dianhydride, 3,3',4,4'-biphenyltetracarboxylic acid dianhydride, and 3,3',4,4'-diphenylsulfonetetracarboxylic acid dianhydride. Regarding the acid anhydride, one kind thereof may be used alone, or two or more kinds thereof may be used in combination, according to the purpose, use application, and the like. Incidentally, as described above, a tetravalent organic group derived from the acid anhydride mentioned above can be used as $R_1$ of the above-described Formula (I). From the viewpoint of more satisfactory dielectric characteristics, it is preferable that the acid anhydride is pyromellitic anhydride.

Examples of the diamine include dimer diamine, 2,2-bis (4-(4-aminophenoxy)phenyl)propane, 1,3-bis(4-aminophenoxy)benzene, 4,4'-bis(4-aminophenoxy)biphenyl, 4,4'-diamino-3,3'-dihydroxybiphenyl, 1,3-bis [2-(4-aminophenyl)-2-propyl]benzene, 1,4-bis [2-(4-aminophenyl)-2-propyl] benzene, polyoxyalkylenediamine, and [3,4-bis(1-aminoheptyl)-6-hexyl-5-(1-octenyl)] cyclohexene. Regarding the diamine, one kind thereof may be used alone, or two or more kinds thereof may be used in combination, according to the purpose, use application, and the like.

The component (A) may also be, for example, a compound represented by the following Formula (XIII).

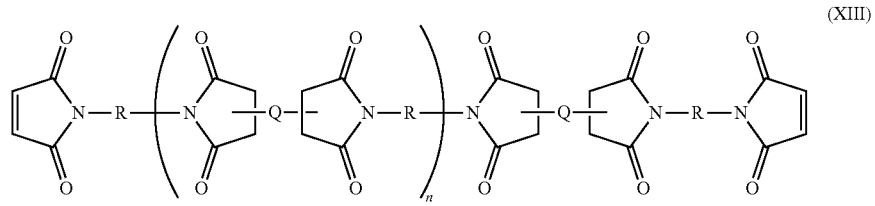

(XIII)

In the formula, R and Q each independently represent a divalent organic group. For R, the same group as the above-mentioned structure (c) can be used, and for Q, the same group as the above-mentioned $R_1$ can be used. Furthermore, n represents an integer from 1 to 10.

As the component (A), a commercially available compound can also be used. Examples of the commercially available compound include commercial products manufactured by Designer Molecules Inc., and specific examples include BMI-1500, BMI-1700, BMI-3000, BMI-5000, and BMI-9000 (all trade names). From the viewpoint of obtaining more satisfactory high frequency characteristics, it is more preferable to use BMI-3000 as the component (A).

((B) Aromatic Maleimide Compound)

The (B) aromatic maleimide compound according to the present embodiment may be referred to as component (B). The component (B) is a maleimide compound different from the component (A). Incidentally, a compound that can come under both the component (A) and the component (B) is considered to belong to the component (A); however, in a case in which two or more kinds of compounds that can come under both the component (A) and the component (B) are included, one of them is considered to belong to the component (A), while the other compound is considered to belong to the component (B). For example, a compound having an aromatic ring that is included in a group represented by Formula (I) may be designated as the component (A), and a compound having an aromatic ring other than the aromatic ring included in the group represented by Formula (I) may be designated as the component (B). By using the component (B), the hygroscopic properties of the resin composition can be reduced. As a cured product of the resin composition containing the component (A) and the component (B) contains a polymer comprising a structural unit formed from the component (A) having low dielectric characteristics and a structural unit formed from the component (B) having low hygroscopic properties, the cured product can have enhanced low hygroscopic properties while maintaining satisfactory dielectric characteristics.

It is preferable that the component (B) has a lower coefficient of thermal expansion than the component (A). Examples of the component (B) having a lower coefficient of thermal expansion than the component (A) include a maleimide group-containing compound having a lower molecular weight than the component (A), a maleimide group-containing compound having more aromatic rings than the component (A), and a maleimide group-containing compound having a shorter main chain than the component (A).

The content of the component (B) in the resin composition is not particularly limited. From the viewpoint of low hygroscopic properties and dielectric characteristics, the content of the component (B) is preferably 1% to 95% by mass, more preferably 3% to 90% by mass, and even more preferably 5% to 85% by mass, with respect to the total mass of the resin composition.

The mixing proportions of the component (A) and the component (B) in the resin composition are not particularly limited. From the viewpoint of low hygroscopic properties and dielectric characteristics, the mass ratio (B)/(A) of the component (A) and the component (B) is preferably 0.01 to 3, more preferably 0.03 to 2, and even more preferably 0.05 to 1.

The component (B) is not particularly limited so long as it has an aromatic ring. Since the aromatic ring is rigid and less thermally expansible, the coefficient of thermal expansion of the resin composition can be reduced by using the component (B) having an aromatic ring. The maleimide group may be bonded to an aromatic ring or may be bonded to an aliphatic chain; however, from the viewpoint of low thermal expansibility, it is preferable that the maleimide group is bonded to an aromatic ring. Furthermore, the component (B) may be a polymaleimide compound containing two or more maleimide groups. Regarding the component (B), one kind thereof may be used alone, or two or more kinds thereof may be used in combination.

Examples of the component (B) include 1,2-dimaleimidoethane, 1,3-dimaleimidopropane, bis(4-maleimidophenyl)methane, bis(3-ethyl-4-maleimidophenyl)methane, bis(3-ethyl-5-methyl-4-maleimidophenyl)methane, 2,7-dimaleimidofluorene, N,N'-(1,3-phenylene)bismaleimide, N,N'-(1,3-(4-methylphenylene))bismaleimide, bis(4-maleimidophenyl)sulfone, bis(4-maleimidophenyl) sulfide, bis(4-maleimidophenyl) ether, 1,3-bis(3-maleimidophenoxy)benzene, 1,3-bis(3-(3-maleimidophenoxy)phenoxy)benzene, bis(4-maleimidophenyl) ketone, 2,2-bis(4-(4-maleimidophenoxy)phenyl)propane, bis(4-(4-maleimidophenoxy)phenyl)sulfone, bis [4-(4-maleimidophenoxy)phenyl] sulfoxide, 4,4'-bis(3-maleimidophenoxy)biphenyl, 1,3-bis(2-(3-maleimidophenyl)propyl)benzene, 1,3-bis(1-(4-(3-maleimidophenoxy)phenyl)-1-propyl)benzene, bis(maleimidocyclohexyl)methane, 2,2-bis [4-(3-maleimidophenoxy)phenyl]-1,1,1,3,3,3-hexafluoropropane, and bis(maleimidophenyl)thiophene. From the viewpoint of further lowering the hygroscopic property and the coefficient of thermal expansion, bis(3-ethyl-5-methyl-4-maleimidophenyl)methane may be used as the component (B). From the viewpoint of further increasing the fracture strength and the metal foil peel strength of the resin film formed from the resin composition, 2,2-bis(4-(4-maleimidophenoxy)phenyl) propane may also be used as the component (B).

From the viewpoint of moldability, a compound represented by the following Formula (VI) may also be used as the component (B).

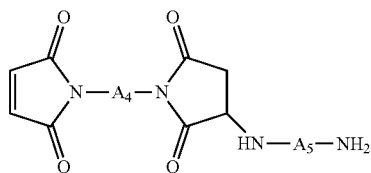
(VI)

In Formula (VI), $A_4$ represents a residue represented by the following Formula (VII), (VIII), (IX), or (X); and $A_5$ represents a residue represented by the following Formula (XI). From the viewpoint of low thermal expansibility, $A_4$ may be a residue represented by the following Formula (VII), (VIII), or (IX).

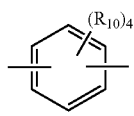
(VII)

In Formula (VII), $R_{10}$'s each independently represent a hydrogen atom, an aliphatic hydrocarbon group having 1 to 5 carbon atoms, or a halogen atom.

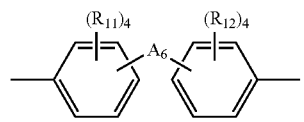
(VIII)

In Formula (VIII), $R_{11}$'s and $R_{12}$'s each independently represent a hydrogen atom, an aliphatic hydrocarbon group having 1 to 5 carbon atoms, or a halogen atom; and $A_6$ represents an alkylene group having 1 to 5 carbon atoms, an alkylidene group, an ether group, a sulfide group, a sulfonyl group, a ketone group, a single bond, or a residue represented by the following Formula (VIII-1).

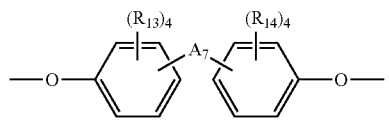
(VIII-1)

In Formula (VIII-1), $R_{13}$'s and $R_{14}$'s each independently represent a hydrogen atom, an aliphatic hydrocarbon group having 1 to 5 carbon atoms, or a halogen atom; and $A_7$ represents an alkylene group having 1 to 5 carbon atoms, an isopropylidene group, an ether group, a sulfide group, a sulfonyl group, a ketone group, or a single bond.

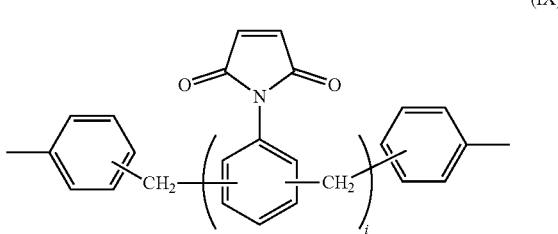
(IX)

In Formula (IX), i represents an integer from 1 to 10.

(X)

In Formula (X), $R_{15}$'s and $R_{16}$'s each independently represent a hydrogen atom or an aliphatic hydrocarbon group having 1 to 5 carbon atoms; and represents an integer from 1 to 8.

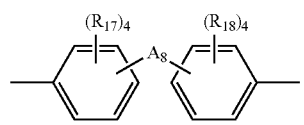
(XI)

In Formula (XI), $R_{17}$'s and $R_{18}$'s each independently represent a hydrogen atom, an aliphatic hydrocarbon group having 1 to 5 carbon atoms, an alkoxy group having 1 to 5 carbon atoms, a hydroxyl group, or a halogen atom; and $A_8$ represents an alkylene group having 1 to 5 carbon atoms, an alkylidene group, an ether group, a sulfide group, a sulfonyl group, a ketone group, a fluorenylene group, a single bond, a residue represented by the following Formula (XI-1), or a residue represented by the following Formula (XI-2).

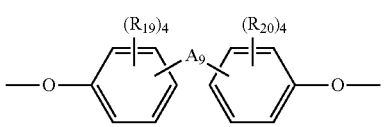
(XI-1)

In Formula (XI-1), $R_{19}$'s and $R_{20}$'s each independently represent a hydrogen atom, an aliphatic hydrocarbon group having 1 to 5 carbon atoms, or a halogen atom; and $A_9$ represents an alkylene group having 1 to 5 carbon atoms, an isopropylidene group, an m-phenylene-diisopropylidene group, a p-phenylene-diisopropylidene group, an ether group, a sulfide group, a sulfonyl group, a ketone group, or a single bond.

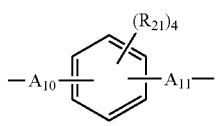
(XI-2)

In Formula (XI-2), $R_{21}$'s each independently represent a hydrogen atom, an aliphatic hydrocarbon group having 1 to 5 carbon atoms, or a halogen atom; and $A_{10}$ and $A_{11}$ each independently represent an alkylene group having 1 to 5 carbon atoms, an isopropylidene group, an ether group, a sulfide group, a sulfonyl group, a ketone group, or a single bond.

From the viewpoints of solubility in an organic solvent, high frequency characteristics, high adhesiveness to a conductor, and the like, the component (B) may be a compound having an amino group and a maleimide group. A compound having an amino group and a maleimide group can be obtained by, for example, subjecting a bismaleimide compound and an aromatic diamine compound having two primary amino groups to a Michael addition reaction in an organic solvent.

Examples of the aromatic diamine compound include 4,4'-diaminodiphenylmethane, 4,4'-diamino-3,3'-dimethyl-diphenylmethane, 2,2'-dimethyl-4,4'-diaminobiphenyl, 2,2-bis(4-(4-aminophenoxy)phenyl)propane, 4,4'-[1,3-phenylenebis(1-methylethylidene)]bisaniline, and 4,4'-[1,4-phenylenebis(1-methylethylidene)]bisaniline. These may be used singly, or two or more kinds thereof may be used in combination.

From the viewpoint that the solubility in an organic solvent is high, the reaction ratio at the time of synthesis is high, and heat resistance can be increased, the aromatic diamine compound may be 4,4'-diaminodiphenylmethane or 4,4-diamino-3,3'-dimethyl-diphenylmethane.

Examples of the organic solvent include alcohol compounds such as methanol, ethanol, butanol, butyl cellosolve, ethylene glycol monomethyl ether, and propylene glycol monomethyl ether; ketone compounds such as acetone methyl ethyl ketone, methyl isobutyl ketone, and cyclohexanone; aromatic hydrocarbons such as toluene, xylene, and mesitylene; ester compounds such as methoxyethyl acetate, ethoxyethyl acetate, butoxyethyl acetate, and ethyl acetate; and nitrogen-containing compounds such as N,N-dimethylformamide, N,N-dimethylacetamide, and N-methyl-2-pyrrolidone. The organic solvents may be used singly, or two or more kinds thereof may be used as a mixture. Among these, methyl ethyl ketone, cyclohexanone, propylene glycol monomethyl ether, N,N-dimethylformamide, and N,N-dimethylacetamide are preferred from the viewpoint of solubility.

(Catalyst)

The resin composition according to the present embodiment may further contain a catalyst for accelerating curing of the component (A). The content of the catalyst is not particularly limited; however, the content may be 0.1% to 5% by mass with respect to the total mass of the resin composition. As the catalyst, for example, a peroxide, an azo compound, or the like can be used.

Examples of the peroxide include dicumyl peroxide, dibenzoyl peroxide, 2-butanone peroxide, tert-butyl perbenzoate, di-tert-butyl peroxide, 2,5-dimethyl-2,5-di(t-butylperoxy)hexane, bis(tert-butylperoxyisopropyl)benzene, and tert-butyl hydroperoxide. Examples of the azo compound include 2,2'-azobis(2-methylpropanenitrile), 2,2'-azobis(2-methylbutanenitrile), and 1,1'-azobis(cyclohexane carbonitrile).

(Inorganic Filler)

The resin composition according to the present embodiment may further contain an inorganic filler. By incorporating any arbitrary appropriate inorganic filler, the low thermal expansion characteristics, high elastic modulus characteristics, heat resistance, flame retardancy, and the like of the adhesive layer can be enhanced. Examples of the inorganic filler include silica, alumina, titanium oxide, mica, beryllia, barium titanate, potassium titanate, strontium titanate, calcium titanate, aluminum carbonate, magnesium hydroxide, aluminum hydroxide, aluminum silicate, calcium carbonate, calcium silicate, magnesium silicate, silicon nitride, boron nitride, calcined clay, talc, aluminum borate, and silicon carbide. These may be used singly, or two or more kinds thereof may be used in combination.

The shape and the particle size of the inorganic filler are not particularly limited. The particle size of the inorganic filler may be, for example, 0.01 to 20 µm or 0.1 to 10 µm. The particle size refers to the average particle size, and when a cumulative frequency distribution curve based on the particle size is determined while taking the total volume of the particles as 100%, the particle size means the particle size at a point corresponding to a volume of 50%. The average particle size can be measured with a particle size distribution analyzer using a laser diffraction scattering method, or the like.

In the case of using an inorganic filler, the amount of use thereof is not particularly limited; however, for example, the content ratio of the inorganic filler with respect to the total amount of the solid content in the resin composition is preferably 3% to 75% by volume, and more preferably 5% to 70% by volume. In a case in which the content ratio of the inorganic filler in the resin composition is in the above-described range, satisfactory curability, moldability, and chemical resistance are easily obtained.

In the case of using an inorganic filler, a coupling agent can be used in combination as necessary, for the purpose of enhancing the dispersibility and the tight adhesiveness to organic components of the inorganic filler, and the like. Regarding the coupling agent, a silane coupling agent, a titanate coupling agent, and the like can be used. These may be used singly, or two or more kinds thereof may be used in combination. The amount of addition of the coupling agent may be, for example, 0.1 to 5 parts by mass or 0.5 to 3 parts by mass with respect to 100 parts by mass of the inorganic filler used. When the amount of addition is in this range, deterioration of general characteristics is reduced, and the features obtainable by using the inorganic filler are likely to be effectively exhibited.

In the case of using a coupling agent, a so-called integral blend treatment method in which an inorganic filler is incorporated into the resin composition and then a coupling agent is added thereto may be used; however, a method of using an inorganic filler obtained by surface-treating an inorganic filler in advance with a coupling agent by a dry method or a wet method is preferred. By using this method, the features of the inorganic filler can be exhibited more effectively.

(Thermosetting Resin)

The resin composition of the present embodiment can further contain (C) a thermosetting resin (hereinafter, may be referred to as "component (C)") different from the component (A) and the component (B). Incidentally, a compound that can come under the component (A) or the component (B) is not considered to belong to the component (C). As the resin composition includes the component (C), the low thermal expansion characteristics and the like of the resin composition can be further enhanced. Examples of the component (C) include an epoxy resin and a cyanate ester resin. Regarding the component (C), one kind thereof may be used alone, or two or more kinds thereof may be used in combination.

Examples of the epoxy resin include a bisphenol A type epoxy resin, a bisphenol F type epoxy resin, a bisphenol S type epoxy resin, an alicyclic epoxy resin, an aliphatic chain-like epoxy resin, a phenol novolac type epoxy resin, a cresol novolac type epoxy resin, a bisphenol A novolac type epoxy resin, a phenol aralkyl type epoxy resin, a naphthalene skeleton-containing epoxy resin such as a naphthol novolac type epoxy resin or a naphthol aralkyl type epoxy resin, a bifunctional biphenyl type epoxy resin, a biphenyl aralkyl type epoxy resin, a dicyclopentadiene type epoxy resin, and a dihydroanthracene type epoxy resin. From the viewpoints of high frequency characteristics and thermal expansion characteristics, a naphthalene skeleton-containing epoxy resin or a biphenyl aralkyl type epoxy resin may be used.

Examples of the cyanate ester resin include 2,2-bis(4-cyanatophenyl)propane, bis(4-cyanatophenyl)ethane, bis(3,5-dimethyl-4-cyanatophenyl)methane, 2,2-bis(4-cyanatophenyl)-1,1,1,3,3,3-hexafluoropropane, α,α'-bis(4-cyanatophenyl)-m-diisopropylbenzene, a cyanate ester compound of a phenol-added dicyclopentadiene polymer, a phenol novolac type cyanate ester compound, and a cresol novolac type cyanate ester compound. When a comprehensive balance between low price, high frequency characteristics, and other characteristics is considered, 2,2-bis(4-cyanatophenyl) propane may be used.

(Curing Agent)

In a case in which the resin composition according to the present embodiment contains the component (C), the resin composition may further contain a curing agent for the component (C). Thereby, the reaction performed at the time of obtaining a cured product of the resin composition can proceed smoothly, and it is also possible to appropriately regulate the physical properties of the cured product of the resin composition. Regarding the curing agent, one kind thereof may be used alone, or two or more kinds thereof may be used in combination.

Examples of the curing agent for an epoxy resin include polyamine compounds such as diethylenetriamine, triethylenetetramine, diaminodiphenylmethane, m-phenylenediamine, and dicyan diamide; polyphenol compounds such as bisphenol A, a phenol novolac resin, a cresol novolac resin, a bisphenol A novolac resin, and a phenol aralkyl resin; acid anhydrides such as phthalic anhydride and pyromellitic anhydride; carboxylic acid compounds; and active ester compounds.

Examples of the curing agent for a cyanate ester resin include a monophenol compound, a polyphenol compound, an amine compound, an alcohol compound, an acid anhydride, and a carboxylic acid compound.

(Curing Accelerator)

In the resin composition according to the present embodiment, a curing accelerator may be further incorporated depending on the type of the component (C). Examples of the curing accelerator for an epoxy resin include an imidazole-based curing accelerator, a $BF_3$-amine complex, and a phosphorus-based curing accelerator. From the viewpoints of the storage stability of the resin composition, handleability of a semi-cured resin composition, and solder heat resistance, an imidazole-based curing accelerator and a phosphorus-based curing accelerator are preferred.

(Thermoplastic Resin)

The resin composition according to the present embodiment may further contain a thermoplastic resin, from the viewpoint of increasing the resin film handleability. The type of the thermoplastic resin is not particularly limited, and the molecular weight is also not limited; however, from the viewpoint of further increasing the compatibility with the component (A), it is preferable that the number average molecular weight (Mn) is 200 to 60000.

From the viewpoints of film-forming properties and resistance to moisture absorption, it is preferable that the then isoplastic resin is a thermoplastic elastomer. Examples of the thermoplastic elastomer include a saturated thermoplastic elastomer, and examples of the saturated thermoplastic elastomer include a chemically modified, saturated thermoplastic elastomer and a non-modified saturated thermoplastic elastomer. Examples of the chemically modified, saturated thermoplastic elastomer include a styrene-ethylene-butylene copolymer modified with maleic anhydride. Specific examples of the chemically modified, saturated thermoplastic elastomer include Tuftec M1911, M1913, and M1943 (manufactured by Asahi Kasei Corp., trade name). On the other hand, examples of the non-modified saturated thermoplastic elastomer include a non-modified styrene-ethylene-butylene copolymer. Specific examples of the non-modified saturated thermoplastic elastomer include Tuftec H1041, H1051, H1043, and H1053 (manufactured by Asahi Kasei Corp., trade name).

From the viewpoints of film-forming properties, dielectric characteristics, and resistance to moisture absorption, it is more preferable that the saturated thermoplastic elastomer has a styrene unit in the molecule. Incidentally, according to the present specification, a styrene unit refers to a unit derived from a styrene monomer in a polymer, and a saturated thermoplastic elastomer means that all aliphatic hydrocarbon moieties other than the aromatic hydrocarbon moiety of a styrene unit have a structure composed of saturated bonding groups.

The content ratio of a styrene unit in the saturated thermoplastic elastomer is not particularly limited; however, the content ratio is preferably 10% to 80% by mass, and more preferably 20% to 70% by mass, as a mass percentage of the styrene unit with respect to the total mass of the saturated thermoplastic elastomer. When the content ratio of the styrene unit is in the above-described range, the resin composition tends to be excellent in terms of film external appearance, heat resistance, and adhesiveness.

Specific examples of the saturated thermoplastic elastomer having a styrene unit in the molecule include a styrene-ethylene-butylene copolymer. A styrene-ethylene-butylene copolymer can be obtained by, for example, performing hydrogenation of an unsaturated double bond carried by a structural unit derived from butadiene in a styrene-butadiene copolymer.

The content of the thermoplastic resin is not particularly limited; however, from the viewpoint of further improving dielectric characteristics, the content may be 0.1% to 15% by mass, 0.3% to 10% by mass, or 0.5% to 5% by mass, with respect to the total amount of the solid content of the resin composition.

(Flame Retardant)

In the resin composition according to the present embodiment, a flame retardant may be further incorporated. The flame retardant is not particularly limited; however, a bromine-based flame retardant, a phosphorus-based flame retardant, a metal hydroxide, and the like are suitably used. The flame retardants may be used singly, or two or more kinds thereof may be used in combination.

Examples of the bromine-based flame retardant include brominated epoxy resins such as a brominated bisphenol A type epoxy resin and a brominated phenol novolac type epoxy resin; brominated additive type flame retardants such as hexabromobenzene, pentabromotoluene, ethylenebis(pentabromophenyl), ethylenebistetrabromophthalimide, 1,2-dibromo-4-(1,2-dibromoethyl)cyclohexane, tetrabromocyclooctane, hexabromocyclododecane, bis(tribromophenoxy)ethane, brominated polyphenylene ether, brominated polystyrene, and 2,4,6-tris(tribromophenoxy)-1,3,5-triazine; and unsaturated double bond group-containing brominated reactive type flame retardants such as tribromophenylmaleimide, tribromophenyl acrylate, tribromophenyl methacrylate, tetrabromobisphenol A type dimethacrylate, pentabromobenzyl acrylate, and brominated styrene.

Examples of the phosphorus-based flame retardant include aromatic phosphoric acid esters such as triphenyl phosphate, tricresyl phosphate, trixylenyl phosphate, cresyl diphenyl phosphate, cresyl di-2,6-xylenyl phosphate, and resorcinol bis(diphenyl phosphate); phosphonic acid esters such as divinyl phenyl phosphonate, diallyl phenyl phosphonate, and bis(1-butenyl) phenyl phosphonate; phosphinic acid esters such as phenyl diphenyl phosphinate, methyl diphenyl phosphinate, and a 9,10-dihydro-9-oxa-10-phosphaphenanthrene-10-oxide derivative; phosphazene compounds such as bis(2-allylphenoxy)phosphazene and dicresylphosphazene; and phosphorus-based flame retardants such as melamine phosphate, melamine pyrophosphate, melamine polyphosphate, melam polyphosphate, ammonium polyphosphate, a phosphorus-containing vinylbenzyl compound, and red phosphorus. Examples of the metal hydroxide flame retardant include magnesium hydroxide and aluminum hydroxide.

The resin composition according to the present embodiment can be obtained by uniformly dispersing and mixing the above-described various components. The means for preparation, conditions, and the like for the resin composition are not particularly limited. The resin composition may be produced by, for example, a method of sufficiently uniformly stirring and mixing predetermined amounts of incorporation of various components using a mixer or the like, subsequently kneading the mixture using a mixing roll, an extruding machine, a kneader, a roll, an extruder, or the like, and further cooling and pulverizing the kneaded product thus obtained.

The relative per nittivity of a cured product (adhesive layer after curing) of the resin composition according to the present embodiment is not particularly limited; however, from the viewpoint of suitably using the cured product in a high frequency band, the relative permittivity at 10 GHz is preferably 3.6 or less, more preferably 3.1 or less, and even more preferably 3.0 or less. The lower limit of the relative permittivity is not particularly limited; however, for example, the lower limit may be about 1.0. Furthermore, from the viewpoint of suitably using the cured product in a high frequency band, the dielectric loss tangent of the cured product of the resin composition is preferably 0.004 or less, and more preferably 0.003 or less. The lower limit of the dielectric loss tangent is not particularly limited, and for example, the lower limit may be about 0.0001. The relative permittivity and the dielectric loss tangent can be measured by the methods disclosed in the Examples described below.

From the viewpoint of suppressing warpage of a laminated sheet, the coefficient of thermal expansion of the cured product of the resin composition is preferably 10 to 90 ppm/° C., more preferably 10 to 45 ppm/° C., and even more preferably 10 to 40 ppm/° C. The coefficient of thermal expansion can be measured according to IPC-TM-650 2.4.24.

The method for producing a resin film is not limited. For example, a resin film may be obtained by applying the resin composition on a supporting base material and drying a resin layer thus formed. Specifically, the above-described resin composition may be applied on a supporting base material using a kiss coater, a roll coater, a comma coater, or the like, and then the resin composition may be dried in a heating and drying furnace or the like, for example, at a temperature of 70° C. to 250° C., and preferably 70° C. to 200° C., for 1 to 30 minutes, and preferably 3 to 15 minutes. Thereby, a resin film in which the resin composition is in a semi-cured state can be obtained.

The resin film can be thermally cured by further heating the resin film in a semi-cured state in a heating furnace, for example, at a temperature of 170° C. to 250° C., and preferably 185° C. to 230° C., for 60 to 150 minutes.

The thickness of the resin film is not particularly limited; however, the thickness may be 0.01 to 2.0 times, 0.05 to 1.0 times, or 0.1 to 0.9 times, the thickness of the fluororesin substrate. When the thickness of the resin film is 2.0 times or less, the dielectric constant of the laminate is easily decreased. When the thickness of the resin film is 0.01 times or more, the rigidity and dimensional stability as a laminate are easily enhanced. The thickness of the resin film may be, for example, 1 to 200 μm, 3 to 180 μm, 5 to 150 μm, 10 to 100 μm, or 15 to 80 μm.

The supporting base material is not particularly limited; however, it is preferable that the supporting base material is at least one selected from the group consisting of a glass plate, a metal foil, and a polyethylene terephthalate (PET) film. When the resin film comprises a supporting base material, the storability and the handleability at the time of being used for the production of a laminate tend to be improved.

[Fluororesin Substrate]

Examples of the fluororesin that constitutes the fluororesin substrate 1 include polytetrafluoroethylene (PTFE), a tetrafluoroethylene-perfluoroalkyl vinyl ether copolymer (PFA), a tetrafluoroethylene-perfluoroalkoxyethylene polymer (PFE), a tetrafluoroethylene-hexafluoropropylene polymer (FEP), and a tetrafluoroethylene-ethylene copolymer (ETFE). In view of having superior high frequency characteristics, the fluororesin substrate is preferably a substrate including polytetrafluoroethylene.

The dielectric constant (Dk) of the fluororesin substrate may be 2.2 to 3.5 or 2.8 to 3.1. The dielectric loss tangent (Df) of the fluororesin substrate may be 0.0010 to 0.0020 or 0.0010 to 0.0013. The coefficient of thermal expansion of the fluororesin substrate may be 30 or less or 20 or less in the direction of the base material. From the viewpoint of enhancing the insulation reliability and antenna characteristics of the laminate, the thickness of the fluororesin substrate may be 100 μm or more, 110 μm or more, or 120 μm or more, and may be 12700 μm or less, 6350 μm or less, or 2540 μm or less.

[Metal Foil]

Figure 2:
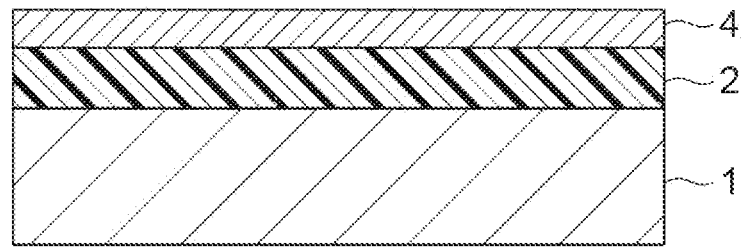
FIG. 2 is a schematic cross-sectional view illustrating an embodiment of the fluororesin substrate laminate.

On the fluororesin substrate laminate comprising a fluororesin substrate and an adhesive layer, a metal foil can be further laminated. FIG. 2 is a schematic cross-sectional view illustrating an embodiment of a fluororesin substrate laminate comprising a metal foil. The laminate comprises a fluororesin substrate 1; an adhesive layer 2 provided on the fluororesin substrate 1; and a metal foil 4 laminated on the adhesive layer 2. The fluororesin substrate 1 and the metal foil 4 are adhered by means of the adhesive layer 2.

As the metal foil according to the present embodiment, a metal foil having low surface roughness (low-roughened metal foil) can be used. The surface roughness of the metal foil may be 0.05 to 2 μm, 0.1 to 1.5 μm, or 0.15 to 1 μm. The thickness of the metal foil may be 5 to 105 μm, 8 to 70 μm, 10 to 40 μm, or 10 to 20 μm. As the metal foil, an electrolytic copper foil may be used, from the viewpoint of peel strength.

The fluororesin substrate laminate comprising a metal foil may be produced by forming an adhesive layer 2 on a fluororesin substrate 1, and then laminating a metal foil 4 on the adhesive layer 2, or may be produced by laminating a fluororesin substrate 1, a resin film, and a metal foil 4 in this order. The fluororesin substrate laminate according to the present embodiment may also be a laminate in which an adhesive layer 2 is formed on both surfaces of a fluororesin substrate 1, and a metal foil 4 is laminated on each of the adhesive layers 2.

<Laminated Sheet>

According to the present embodiment, a metal-clad laminated sheet can be produced by providing a laminated sheet having a resin layer including a cured product of a resin composition and a conductor layer.

The method for producing a metal-clad laminated sheet is not limited. For example, one sheet or a plurality of sheets of the above-described resin film is superposed on both surfaces of a fluororesin substrate, a metal foil that serves as a conductor layer is disposed on at least one surface, the assembly is heated and pressurized, for example, at a temperature of 170° C. to 250° C., and preferably 185° C. to 230° C., and a pressure of 0.5 to 5.0 MPa for 60 to 150 minutes, and thereby a metal-clad laminated sheet comprising a metal foil on at least one surface of a resin layer that serves as an insulating layer is obtained. Heating and pressurizing can be carried out, for example, under the conditions of a degree of vacuum of 10 kPa or less, and preferably 5 kPa or less, and from the viewpoint of increasing the efficiency, it is preferable that heating and pressurizing is carried out in a vacuum. It is preferable that heating and pressurizing is carried out for a period ranging from 30 minutes after the initiation to the molding completion time. The metal-clad laminated sheet may also be produced by disposing a metal foil 4 on an adhesive layer 2 of a fluororesin substrate comprising a fluororesin substrate 1 and an adhesive layer 2, and heating and pressurizing the assembly.

Thus, suitable embodiments of the present invention have been described; however, these are merely examples for illustrating the present invention, and the scope of the present invention is not intended to be limited only to these embodiments. The present invention can be carried out in various forms different from the above-described embodiments, to the extent that the gist of the invention is maintained.

EXAMPLES

Hereinafter, the present invention will be described in more detail based on Examples and Comparative Examples. However, the present invention is not intended to be limited to the following Examples.

[Resin Composition]

Example 1

Into a vessel equipped with a stirring apparatus, 104.4 g of silica slurry (manufactured by Admatechs Co., Ltd., trade name "SC-2050KNK"), 9.1 g of toluene, 21.3 g of component (A), 5.1 g of component (B), and 0.53 g of a catalyst (2,5'-dimethyl-2,5-di(t-butylperoxy)hexane, manufactured by NOF Corp., trade name "PERHEXYNE 25B") were introduced, and the mixture was mixed by stirring for one hour at 25° C. The mixture was filtered using a #200 nylon mesh, and a resin composition was obtained.

Comparative Example 1

A resin composition was obtained in the same manner as in Example 1, except that the component (A) was not used.

Comparative Example 2

A resin composition was obtained in the same manner as in Example 1, except that the component (B) was not used.

Component (A): A maleimide compound having a structure represented by the following Formula (XII-3) (manufactured by Designer Molecules Inc., trade name "BMI-1500") was used as the component (A).

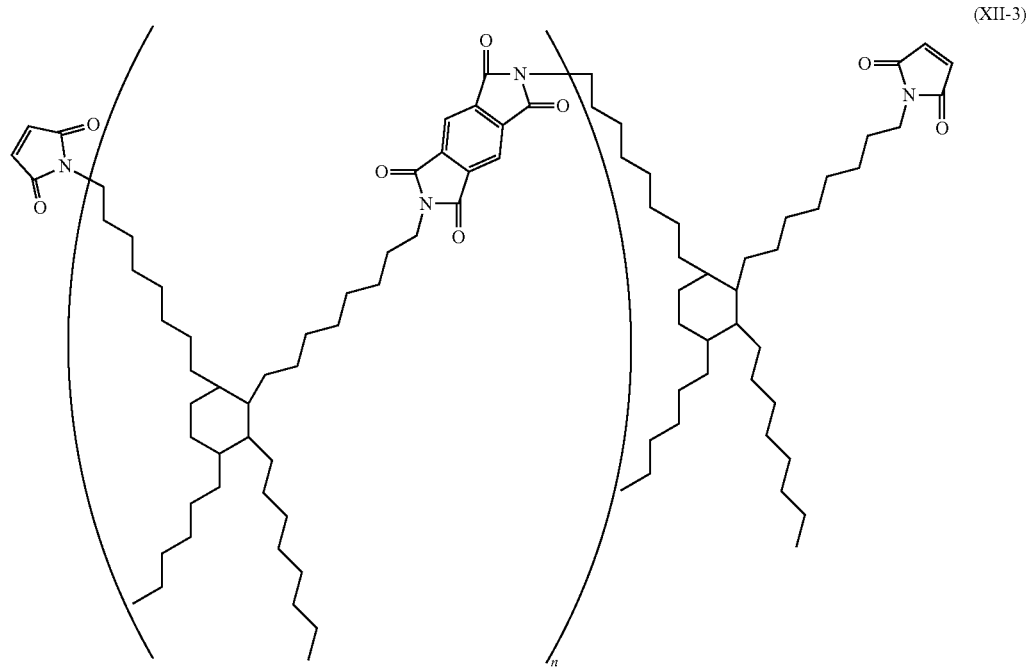

(XII-3)

Component (B): 2,2-Bis(4-(4-maleimidophenoxy)phenyl)propane (manufactured by Daiwa Kasei Industry Co., Ltd., trade name "BMI-4000"), which is an aromatic maleimide compound, was used as the component (B).

[Resin Film]

The resin composition was applied on a PET film (manufactured by Teijin, Ltd., trade name "G2-38", thickness: 38 μm) using a comma coater, subsequently the resin composition was dried at 130° C., and thereby a PET film-attached resin film comprising a resin layer in a semi-cured state was produced. The thickness of the resin film (adhesive layer) was 65 μm.

[Laminated Sheet]

On both surfaces of a PTFE substrate obtained by subjecting two copper foil surfaces of a PTFE substrate for high-frequency use (Rogers Corp., trade name "RO3003", thickness: 127 μm) to overall etching, the resin film from which a PET film had been peeled off was mounted, and a copper foil (manufactured by Furukawa Electric Co., Ltd., trade name "FZ-WS", thickness: 18 surface roughness: 0.2 μm or less) was laminated thereon. Next, an end plate was mounted on the laminate, the assembly was molded by heating and pressurizing under the pressing conditions of 200° C./3.0 MPa/70 minutes, and thereby a double-sided metal-clad laminated sheet was produced.

[Evaluation]

For the double-sided metal-clad laminated sheet and the PTFE substrate for high-frequency use, the following evaluations were carried out. The results are presented in Table 1.

(Dielectric Characteristics)

The relative permittivity (Dk) and dielectric loss tangent (Df), which are dielectric characteristics, were measured by a cavity resonator perturbation method using a specimen obtained by etching the outer layer copper foil of the double-sided metal-clad laminated sheet. The measurement conditions were set at a frequency of 10 GHz and a measurement temperature of 25° C.

(Hygroscopic Solder Heat Resistance)

For the hygroscopic solder heat resistance, the copper foil on a single side of the double-sided metal-clad laminated sheet was etched and cut into a square that measured 50 mm on each side, and the cut laminated sheet was used as a specimen and was treated for one hour in a pressure cooker test (PCT) apparatus (conditions: 121° C., 2.2 atmospheres). The resultant was floated on molten solder at 288° C. for 20 seconds, and the presence or absence of blistering was visually evaluated.

(Transmission Loss Property)

The copper foil on a single side of the double-sided metal-clad laminated sheet produced in Example 1 was etched, a microstrip line having a length of 10 cm and a width of 65 μm was produced therefrom, and the transmission loss was measured under the conditions of an impedance of 50Ω, a temperature of 25° C., and a humidity of 60%. As Comparative Example 3, the transmission loss was similarly measured using a PTFE substrate for high-frequency use (Rogers Corp., trade name "RO3003", thickness: 127 μm).

TABLE 1

| | Example 1 | Comparative Example 1 | Comparative Example 2 | Comparative Example 3 |
|---|---|---|---|---|
| Dk (10 GHz) | 3.0 | 3.7 | 2.9 | — |
| Df (10 GHz) | 0.0023 | 0.007 | 0.0016 | — |

TABLE 1-continued

| | Example 1 | Comparative Example 1 | Comparative Example 2 | Comparative Example 3 |
|---|---|---|---|---|
| Hygroscopic solder heat resistance | Absent | Absent | Present | — |
| Transmission loss (10 GHz) | −0.087 | — | — | −0.136 |

What is claimed is:

1. A fluororesin substrate laminate for a high-frequency circuit, the fluororesin substrate laminate comprising a fluororesin substrate and an adhesive layer provided on the fluororesin substrate, wherein the fluororesin substrate has a dielectric loss tangent measured at a frequency of 10 GHz and a measurement temperature of 25° C. of 0.0010 to 0.0020, and a coefficient of thermal expansion of 30 ppm/° C. or less in a direction of the fluororesin substrate, wherein the fluororesin substrate has a thickness of 120 μm to 12700 μm, and wherein the adhesive layer includes a resin composition containing: (A) a maleimide compound having a saturated or unsaturated divalent hydrocarbon group; and (B) an aromatic maleimide compound.

2. The fluororesin substrate laminate according to claim 1, wherein the fluororesin substrate is a substrate including polytetrafluoroethylene.

3. The fluororesin substrate laminate according to claim 1, wherein the (B) aromatic maleimide compound has a structure having a maleimide group bonded to an aromatic ring.

4. The fluororesin substrate laminate according to claim 1, wherein the saturated or unsaturated divalent hydrocarbon group has 8 to 100 carbon atoms.

5. The fluororesin substrate laminate according to claim 1, wherein the saturated or unsaturated divalent hydrocarbon group is a group represented by the following Formula (II):

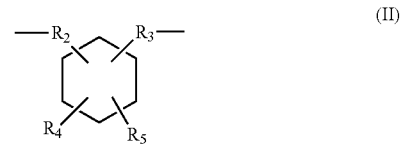

(II)

wherein in Formula (II), $R_2$ and $R_3$ each independently represent an alkylene group having 4 to 50 carbon atoms; $R_4$ represents an alkyl group having 4 to 50 carbon atoms; and $R_5$ represents an alkyl group having 2 to 50 carbon atoms.

6. The fluororesin substrate laminate according to claim 1, wherein the (A) maleimide compound having a saturated or unsaturated divalent hydrocarbon group further has a divalent group having at least two imide bonds.

7. The fluororesin substrate laminate according to claim 6, wherein the divalent group having at least two imide bonds is a group represented by the following Formula (I):

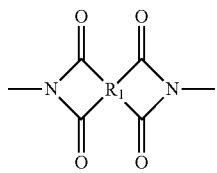

wherein in Formula (I), $R_1$ represents a tetravalent organic group.

8. The fluororesin substrate laminate according to claim 1, wherein the (A) maleimide compound having a saturated or unsaturated divalent hydrocarbon group has a weight average molecular weight of 500 to 10000.

9. The fluororesin substrate laminate according to claim 1, further comprising a metal foil on the adhesive layer.

10. The fluororesin substrate laminate according to claim 9, wherein the metal foil has a surface roughness of 0.05 to 2 μm.

11. The fluororesin substrate laminate according to claim 1, wherein the resin composition further comprises a cyanate ester resin.

12. The fluororesin substrate laminate according to claim 1, wherein the resin composition further comprises a styrene-ethylene-butylene copolymer modified with maleic anhydride.

13. The fluororesin substrate laminate according to claim 1, wherein the fluororesin substrate has a dielectric loss tangent measured at a frequency of 10 GHz and a measurement temperature of 25° C. of 0.0010 to 0.0013.

14. The fluororesin substrate laminate according to claim 1, wherein the fluororesin substrate has a dielectric constant measured at a frequency of 10 GHz and a measurement temperature of 25° C. of 2.2 to 3.5.

* * * * *